United States Patent [19]

Suda

[11] Patent Number: 4,823,178
[45] Date of Patent: Apr. 18, 1989

[54] PHOTOSENSOR SUITED FOR IMAGE SENSOR

[75] Inventor: Yoshiyuki Suda, Yokohama, Japan

[73] Assignee: Kabushiki Kaisha Toshiba, Kawasaki, Japan

[21] Appl. No.: 780,598

[22] Filed: Sep. 26, 1985

[30] Foreign Application Priority Data

Sep. 29, 1984 [JP]  Japan .................. 59-204806

[51] Int. Cl.[4] .................................. H01L 27/14
[52] U.S. Cl. .................................. 357/30; 357/51;
357/2; 357/23.7; 357/4
[58] Field of Search ................. 357/30 K, 30 P, 30 I,
357/30 G, 2, 23.7, 4, 51, 31, 84

[56] References Cited

U.S. PATENT DOCUMENTS

| | | | |
|---|---|---|---|
| 4,346,395 | 8/1982 | Hitachi | 357/30 |
| 4,461,956 | 7/1984 | Canon | 357/32 |
| 4,471,371 | 9/1984 | Hamano | 357/31 |
| 4,517,733 | 5/1985 | Hamano | 357/31 X |
| 4,598,305 | 7/1986 | Chiang et al. | 357/4 X |
| 4,601,097 | 7/1986 | Shimbo | 357/84 X |
| 4,651,185 | 3/1987 | Holmberg | 357/4 X |

FOREIGN PATENT DOCUMENTS 57-46224 10/1982 Japan .
59-25280  2/1984 Japan .

OTHER PUBLICATIONS

Patent Abstracts of Japan, vol. 6, No. 211 (E-137)[1089], Oct. 23, 1982 & JP-A-57 114 292 (Fuji Xerox K.K.) 16-07-1982 *abstract*.
Applied Physics A. Solids and Surfaces, vol. A34, No. 3, Jul. 1984, pp. 175-178, Heidelberg; A. J. Snell et al.: "A New Vertically Integrated Amorphous Silicon Addressable Image Sensor" *abstract; FIG. 2*.
Japanese Journal of Applied Physics Supplements, Supplement 15th Conference 1983, pp. 201-204, Tokyo, JP; F. Okumura et al.: "Amorphous Si:H Linear Image Sensor Operated by a-Si:H TFT Array"*FIG. 4*.

*Primary Examiner*—Thomas H. Tarcza
*Assistant Examiner*—John B. Sotomayor
*Attorney, Agent, or Firm*—Oblon, Fisher, Spivak, McClelland & Maier

[57] ABSTRACT

A photosensor for realizing an image sensor which can meet the requirements of high resolution, high operation speed and high signal-to-noise ratio is disclosed. The photosensor comprises a circuit substrate, a thin film transistor formed on the circuit substrate and an amorphous silicon photodiode formed on the substrate integral with the thin transistor between the drain and gate electrodes thereof. Also formed on the circuit substrate adjacent to the thin film transistor and photodiode are a charging switch element for coupling the photodiode to a DC power source to charge an inter-electrode capacitance of the photodiode, a charge storage capacitor charged by a channel current of the thin film transistor controlled by an inter-electrode capacitance voltage of the photodiode which varies in response to incident light after the inter-electrode capacitance has been charged, and a detecting switch element for coupling the capacitor to an output amplifier. The charging and detecting switch elements are each formed of a thin film transistor.

8 Claims, 6 Drawing Sheets

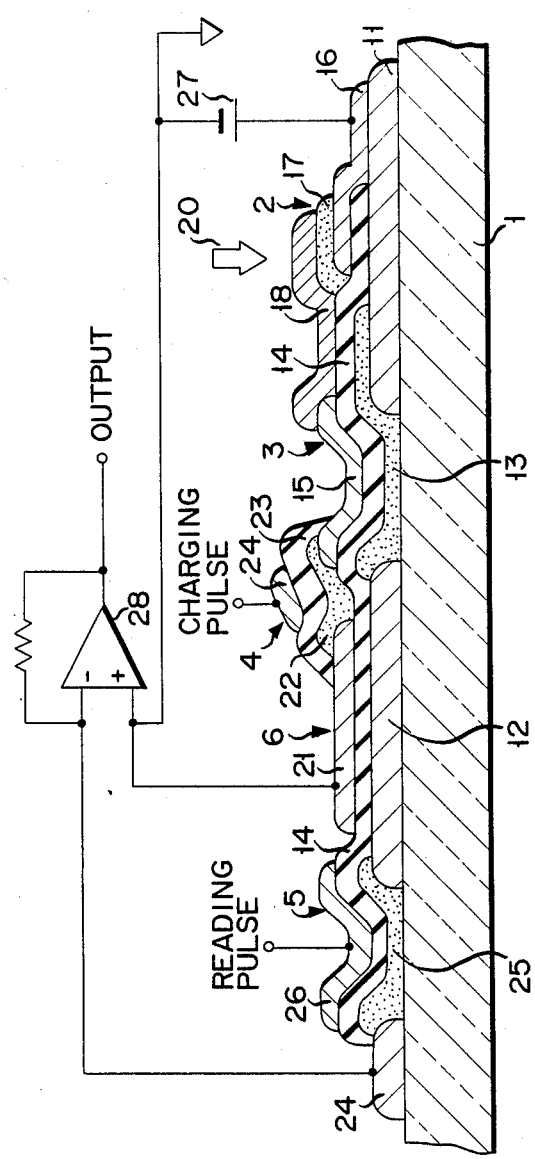
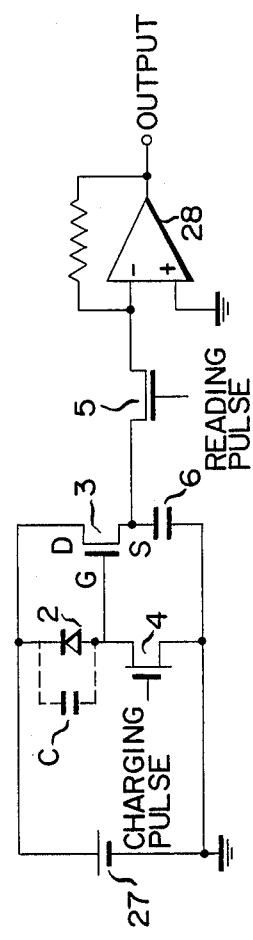
FIG. 1
FIG. 2

PHOTOSENSOR SUITED FOR IMAGE SENSOR

BACKGROUND OF THE INVENTION

The invention relates to a photosensor and, more particularly, to a photosensor suited for an image sensor.

A photodiode using hydrogenated amorphous silicon (a-Si:H) film has attracting attention as an image sensor element for use in such an apparatus as an electronic copier and a facsimile apparatus. Since the a-Si:H film has high photosensitivity and can be easily made large in area, it is particularly suited for a contact type image sensor.

An image sensor is formed by arranging a great number of photodiodes in line. The photodiode usually takes a sandwich structure in which an a-Si:H film is sandwiched between upper and lower electrodes. The lower electrode is made of chromium (Cr) or like, while the upper electrode is made of transparent, electrically conductive film such as indium tin oxide (ITO) film. In this structure, a Schottky barrier is formed at interface between the a-Si:H film and upper electrode, thus exhibiting a diode characteristic. The lower electrode serves as a cathode electrode, and the upper electrode as an anode electrode.

A large number of such photodiodes are formed in line on a substrate, thus constituting an image sensor. The anode of each photodiode is connected to the negative terminal of a DC power supply, and the cathode of the photodiode is connected through a charging switch to the positive terminal of the DC power supply. The cathode of the photodiode is connected through a charge readout switch to a common output amplifier. When the charging switch is turned on, inter-electrode capacitor of the photodiode is charged. When the charging switch is turned off, the inter-electrode capacitor is discharged in response to light incident on the anode electrode. Subsequently, the charge readout switch is turned on, so that a signal voltage across the capacitor is read out by the output amplifier.

The signal voltage taken from the capacitor is proportional to the product of the light-receiving area, illumination intensity and storage time. The recent trend for higher operation speed and higher resolution calls for smaller light-receiving area and shorter storage time; for instance, a resolution of 16 bits/mm and a storage time of 1 msec. are required. The light-receiving area of one photodiode corresponding to the resolution of 16 bits/mm is $3.91 \times 10^{-3}/\text{mm}^2$. In this case, the inter-electrode capacitance is approximately 0.2 pF. Under conditions of a practical illumination intensity of 500 lx and an internal quantum efficiency of 1, the maximum signal voltage is found to be approximately 6.8 V by calculation.

The noise in the image sensor includes a switching noize component resulting from the switch element (i.e., transistor) and a dark current noise component based on dark current in the photodiode. While the switching noise is irrelevant to temperature, the dark current noise increases with temperature. At 40° C. or below, the signal-to-noise ratio of the read-out signal is 38 dB at the most, which is insufficient in practice. Recently, a signal-to-noise ratio of 80 dB or above in a temperature range of 0 to 80° C. is required in addition to the high operation speed and high resolution.

As another prior art photosensor, a combination of a solar battery and a MOS transistor is known, as is disclosed in Japanese Patent early Publication No. 59-25280 published on Feb. 9, 1984. In this structure, a solar battery using a-Si:H film is formed on a MOS transistor formed on a silicon substrate, connected between the gate and source of this transistor. This drain current of the MOS transistor is controlled by incident light on the solar battery. The substrate is made of silicon crystal, and cannot easily be made large. Therefore, the structure is not suited for a photosensor for use in an image sensor which requires a large area.

SUMMARY OF THE INVENTION

An object of the invention is to provide an improved photosensor.

Another object of the invention is to provide a photosensor which can realize a high signal-to-noise ratio.

A further object of the invention is to provide an image sensor having a high resolution, a high operation speed and a high signal-to-noise ratio.

A photosensor according to the invention comprises a thin film transistor formed on a substrate and having a gate electrode, and drain and source electrodes forming a channel therebetween, in response to a control voltage applied to the gate electrode, through which a channel current controlled by the control voltage flows; an amorphous silicon photodiode formed on the substrate integral with the thin film transistor and between either the drain electrode or source electrode and the gate electrode of the thin film transistor, the amorphous silicon photodiode having an inter-electrode capacitance; charging means for charging the inter-electrode capacitance of the photodiode; and detecting means for detecting the channel current of the thin film transistor controlled by the voltage across the inter-electrode capacitance of the photodiode, which varies in response to incident light after the charging of the inter-electrode capacitance.

The photodiode includes a cathode electrode, an anode electrode consisting of transparent conductive film, and hydrogenated amorphous silicon film sandwiched between the cathode and anode electrodes, the cathode and anode electrodes being electrically connected to the respective drain and gate electrodes of the thin film transistor. Alternatively, the cathode and anode electrodes may be electrically connected to the respective gate and source electrodes of the thin film transistor.

The charging means includes a DC power supply, a charge switching element for coupling the DC power supply to the photodiode to charge the inter-electrode capacitance thereof. The charge switching element is formed of a thin film transistor, formed on the substrate adjacent to the thin film transistor and photodiode, which is turned on and off by an externally applied control signal.

The detecting means includes a charge storage capacitor coupled to the thin film transistor and charged by the channel current thereof; an output amplifier for taking out an output signal of the photosensor; and a detection switching element for coupling the charge storage capacitor to the output amplifier, which is turned on and off by an externally applied control signal. The detecting switching element is formed of a thin film transistor, and the charge storage capacitor and detecting switching element are formed on the circuit substrate.

BRIEF DESCRIPTION OF THE DRAWINGS

FIG. 1 shows an arrangement of a photosensor embodying the invention;

FIG. 2 is a circuit diagram of the photosensor shown in FIG. 1;

DETAILED DESCRIPTION OF THE PREFERRED EMBODIMENTS

Figure 3:
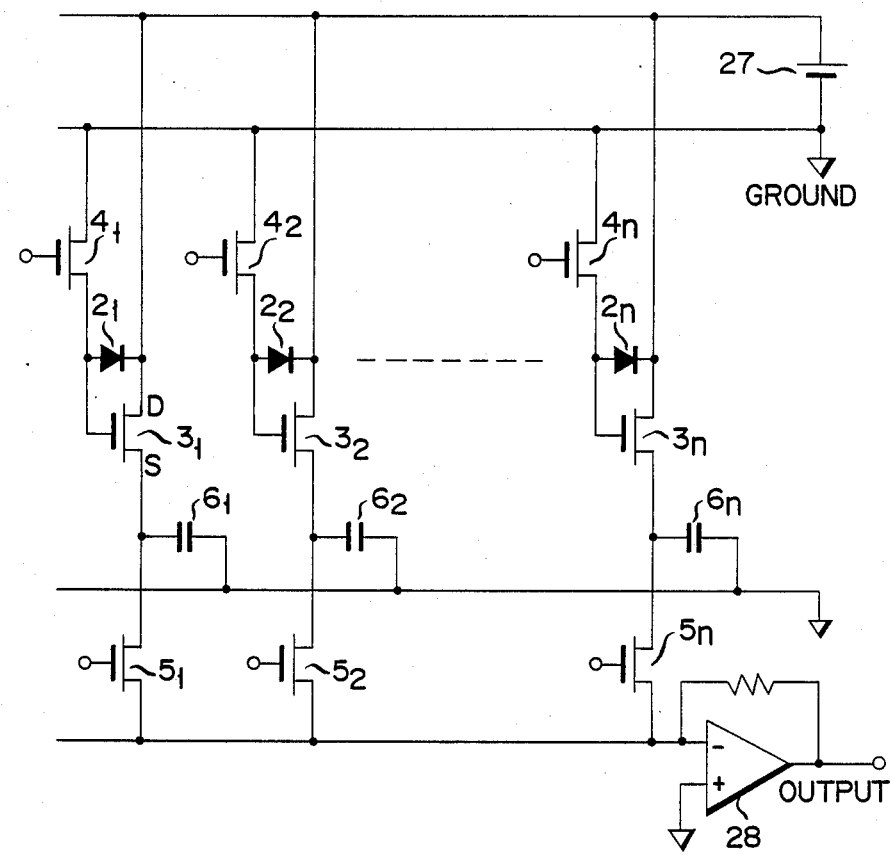
FIG. 3 is a circuit diagram of an image sensor formed of photosensors shown in FIG. 1.

FIG. 1 shows a photosensor of this invention, formed in a staggered configuration on a substrate. The substrate 1 is an insulating plate having a smooth (i.e., lustrous) surface. More specifically, it is an alkali metal-free glass plate having an optically polished major surface. A photodiode 2 of a sandwich structure and a thin film transistor (TFT) 3 are formed on the major surface of substrate 1, integrally and adjacent to each other. A charging transistor (TFT) 4 and a detection transistor (TFT) 5 are formed adjacent to TFT 3 on substrate 1. A capacitor 6 is formed between TFTs 4 and 5. More specifically, TFT 3 has drain and source electrodes 11 and 12 formed on the major surface of substrate 1. Between drain and source electrodes 11 and 12 are sequentially formed an active layer 13 which consists of a-Si:H film, an insulating layer 14 of SiNx, and a gate electrode layer 15 consisting of, for instance, chromium.

Drain and source electrodes 11 and 12 may be formed by vacuum deposition of aluminum and by a subsequent photoetching process (PEP). a-Si:H film 13 and SiNx film 14 may be formed by plasma CVD process, from 100 % SiH$_4$ gas and SiH$_4$/N$_2$ mixture gas, respectively. Gate insulating film 14 may be double-layer film made of a SiNx layer and a SiOx layer, with the SiNx layer provided on the side of active layer 13. Gate electrode 15 may be formed by PEP.

Photodiode 2 has a cathode electrode 16, which is formed of the same material and by the same process as gate electrode 15, on a portion of drain electrode layer 11 that is not covered with insulating film 14 and on a portion of insulating film 14. a-Si:H film 17 is formed on a portion of cathode electrode 16 over insulating layer 14. An anode electrode 18 consisting of transparent conductive film is formed on a-Si:H film 17 and insulating layer 14 so as to partly contact gate electrode 15. As a result, photodiode 2 is formed which has a sandwich structure with the a-Si:H film sandwiched between the anode and cathode electrodes. Evidently, gate electrode 15 and drain electrode 11 of TFT 3 are electrically connected to respective anode and cathode electrodes 18 and 16 of photodiode 2. ITO may be used for a material of the transparent conductive film. Light 20 is incident on a-Si:H film 17 through transparent anode electrode 18 of photodiode 2. Since the TFT and photodiode are formed adjacent to each other on the substrate, a wiring capacitance can be greatly reduced, improving the signal-to-noise ratio.

Charging TFT 4, detection TFT 5 and capacitor 6 are formed integrally with photodiode 2 and TFT 3 on substrate 1. Capacitor 6 is formed of source electrode layer 12, insulating film 14 formed thereon, and electrode layer 21 formed on insulating film 14. Electrode 21 is spaced apart from gate electrode 15 of TFT 3, and a-Si:H film 22 is formed between electrode layer 21 and gate electrode 15. An insulating layer 23 is formed on electrode layer 21, a-Si:H film 22 and gate electrode 15 of TFT 3. A gate electrode 24 is formed on insulating film 23. Thus, charging TFT 4 for charging the inter-electrode capacitance of photodiode 2 is formed. Gate electrode 15 of transistor 3 and electrode 21 of capacitor 6 are used as the drain and source electrodes of charging TFT 4, respectively.

An electrode 24 is formed on the major surface of substrate 1, and an active layer 25, or a-Si:H layer, is formed between electrodes 12 and 24. Insulating layer 14 is formed to extend on electrodes 11 and 12 and active layers 13 and 25. A gate electrode 26 is formed over active layer 25 with insulating layer 14 interposed therebetween. In this way, detection TFT 5 is formed. Electrodes 12 and 24 are used as the drain and source electrodes of detection transistor 5, respectively.

A charging (i.e., reset) pulse and a readout pulse are applied to the gate electrodes of charging TFT 4 and detection TFT 5, respectively. The positive terminal of a power supply 2 with 5 to 6 V is connected to cathode electrode 16 of photodiode 2, while the negative terminal of the power supply is connected to a common potential (i.e., ground) terminal. Capacitor electrode 21 is connected to a non-inverting input of an output amplifier 28, and source electrode 24 of detection transistor 5 is connected to an inverting input of amplifier 28. Amplifier 28 is provided separately from the photosensor circuit formed on substrate 1.

The operation of the photosensor shown in FIG. 1 will now be described with reference to FIG. 2, i.e., a circuit diagram thereof. Charging TFT (switch) 4 and detection TFT (switch) 5 are normally off. They are turned on by a charging pulse and a readout pulse from a control circuit (not shown), respectively. When a charging pulse turns charging TFT 4 on, the inter-electrode capacitance C of photodiode 2 is charged by power supply 27. At this time, TFT 3 is off since its gate electrode 15 is coupled to electrode 21 placed at ground potential through the channel of conducting TFT 4. The drain current of transistor 3 is a small off-current I$_D$off. After charging TFT 3 has been turned off, the inter-electrode capacitance C of photodiode 2 gradually discharges in accordance with photocurrent corresponding to the incident image information light 20. The discharging of inter-electrode capacitance C raises the potential on gate electrode 15 of TFT 3. As a result, a drain current based on the gate potential flows in TFT 3. Capacitor 6 is charged by this drain current. The extent of charging capacitor 6 depends on the intensity of light 20 incident on photodiode 2.

When the read-out pulse is applied to the gate electrode of detection TFT 5, detection TFT 5 is turned on. As a result, the voltage across capacitor 6 is applied to output amplifier 28, so that an output image information signal is obtained.

FIG. 3 shows a circuit diagram of an image sensor in which a plurality of photosensors as described above are arranged in a line. More specifically, in this image sensor, n photosensors, each of which corresponds to one picture element (i.e., one dot) and is constituted by a photodiode 2, a TFT 3, a charging TFT 4, a detection TFT 5 and a capacitor 6, are arranged in line on a substrate. Each photosensor is wired in the manner as shown in FIG. 2. The n photosensors are successively enabled by control signals having charging pulses and read-out pulses. Thus, the image information signal is taken from an output amplifier 28. Where the resolution is 16 dots/mm, n is approximately 3,500.

Figure 4:
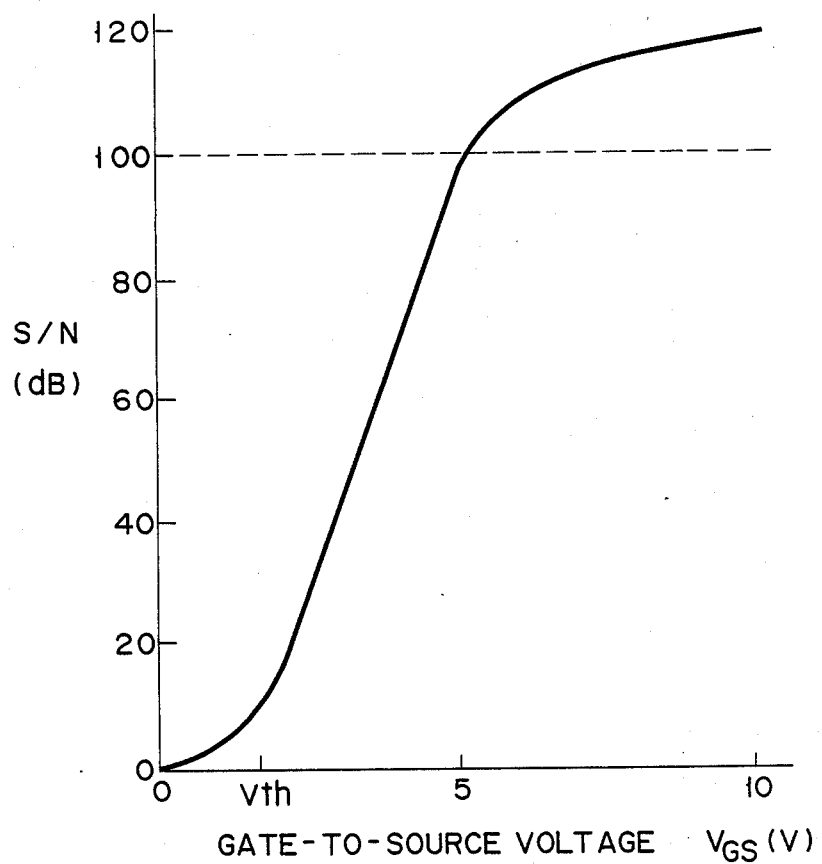
FIG. 4 is a graph showing the relation between the signal-to-noise ratio of the drain current and gate-to-source voltage of a thin film transistor used in the photosensor according to the invention.

FIG. 4 shows a relation between the signal-to-noise ratio of drain current $I_D$ of TFT 3 and gate-source voltage $V_{GS}$ thereof. As is shown, the threshold voltage of TFT 3 is 2 to 3 V, and the signal-to-noise ratio is not less than 100 dB with respect to the drain current when the $V_{GS}$ changes by several volts. The signal voltage taken out from the photodiode having the sandwich structure (i.e., voltage across the inter-electrode capacitor) is 0 to 7 V when the intensity of the incident light is 0.5 lx/sec. Thus, an output signal having a dynamic range of approximately 100 dB can be obtained by controlling the TFT gate voltage with the signal voltage from the photodiode and by detecting the drain current. Thus, an image information signal of a great signal-to-noise ratio can be obtained. Besides, the noise voltage, such as switching noize and dark current noise, is on the order of the threshold voltage of TFT. This indicates that the noise voltage tends to be compressed, to further improve the signal-to-noise ratio.

Figure 5:
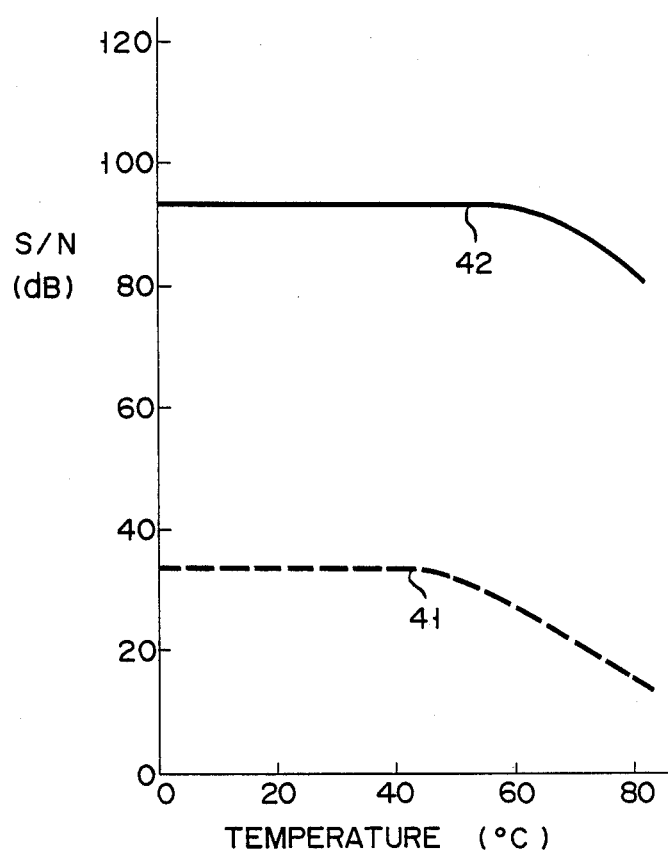
FIG. 5 shows temperature dependency of a prior art photosensor and a photosensor according to the invention.

FIG. 5 shows the temperature-dependency 41 of an output signal of a sandwich type photodiode consisting of a TFT and a photodiode, and also the temperature-dependency 42 of an output signal of the photosensor according to the invention. As is evident from FIG. 5, a signal-to-noise ratio of 80 dB or above can be realized in a temperature range of 0 to 80°C. This can meet the requirements of a high performance image sensor, i.e., the resolution of 16 dots/mm and the readout speed of 1 msec.

The modifications of this invention will be described hereinafter.

The substrate 1 may be made of glazed ceramic or organic film of a polyimide resin which can withstand a high temperature of 400° C. The active layer may be made of a-Si:H film or polycrystalline silicon film formed by a vacuum deposition process or spattering process. The photodiode may have a pin structure or any other structure.

Figure 6:
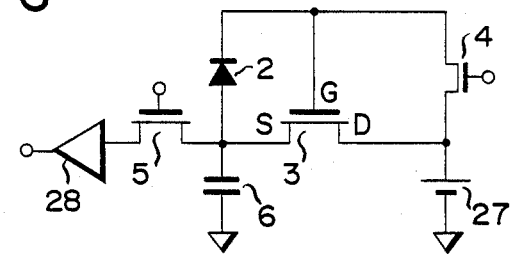
FIG. 6 is a circuit diagram a photosensor according to another embodiment of the invention.

Further, photodiode 2 may be connected between the gate electrode and source electrode of TFT 3 as shown in FIG. 6. It suffices to connect the photodiode between the drain or source electrode a channel, and the gate electrode. (A channel is formed between the drain and source electrodes.)

Figure 7:
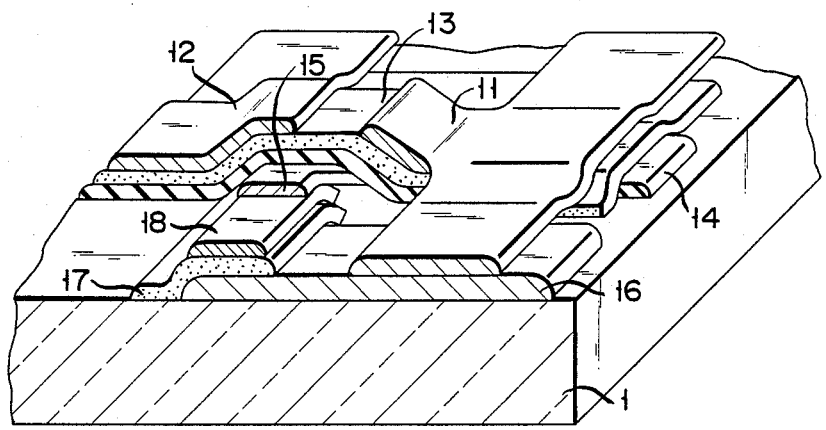
FIGS. 7 to 10 show arrangements of other thin film transistors which may be used in the photosensor of this invention.
Figure 8:
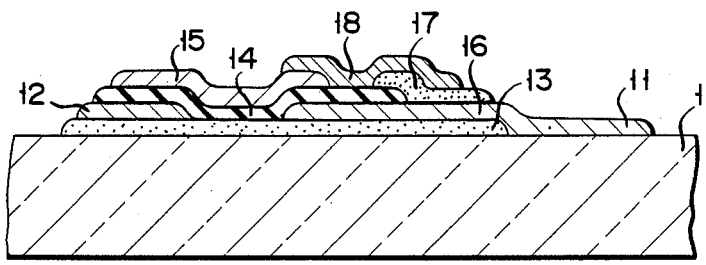

The structure of the photodiode and TFT is not limited to the staggered structure shown in FIG. 1. Further, the positional relationship among drain and source electrodes 11 and 12, active layer 13, insulating layer 14 and gate electrode 15 of the TFT in the direction normal to the major surface of the substrate in FIG. 1 may be reversed as shown in FIG. 7. That is, an inverse staggered structure may be adopted. Further, the TFT may take a coplanar structure in which electrodes 11, 12 and 15 are formed on the same side of active layer 13 as shown in FIG. 8.

Figure 9:
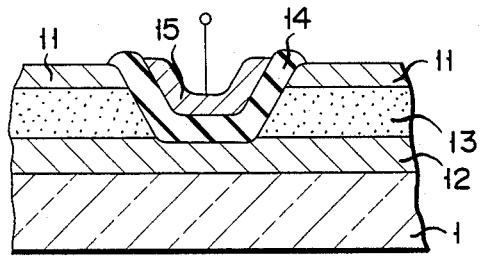
Figure 10:
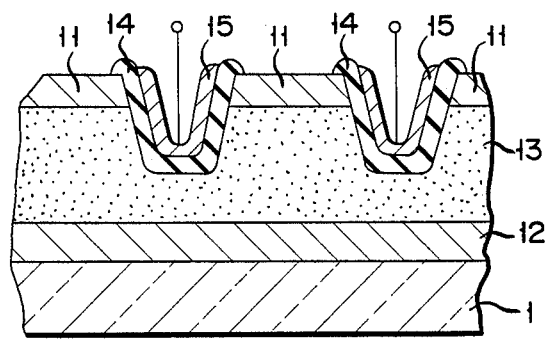

Further, the TFT may have the structures shown in FIGS. 9 and 10. In these Figures, parts like those shown in FIG. 1 are designated by the same numerals. FIG. 9 shows a U MOS or V MOS transistor structure, in which an active layer 13 is sandwiched between drain and source electrodes 11 and 12, and an insulating layer 14 has a U- or V-shape extending from the drain electrode to the source electrode. FIG. 10 shows a SIT (static induction transistor) structure, in which an active layer 10 is sandwiched between drain and source electrodes 11 and 12, and a plurality of gate sections are provided.

The above embodiment is designed such that capacitor 6 is charged by the drain current of the TFT and subsequently the image information signal is read out through switch 5. However, it may be arranged to convert the drain current of the TFT directly into a voltage signal.

What is claimed is:

1. A photosensor comprising:
a circuit substrate;
a thin film transistor formed on said circuit substrate and having a gate electrode and drain and source electrodes forming a channel therebetween in response to a control voltage applied to said gate electrode, a channel current controlled by said control voltage flowing through said channel;
an amorphous silicon photodiode formed on said substrate integral with said thin film transistor between one of said drain and source electrodes and said gate electrode of said thin film transistor, said amorphous silicon photodiode having an inter-electrode capacitance;
charging means coupled to said photodiode for charging said inter-electrode capacitance of said photodiode; and
detecting means coupled to said thin film transistor for detecting the channel current of said thin film transistor which is controlled by a voltage across said inter-electrode capacitance of said photodiode, the voltage varying in response to incident light after said inter-electrode capacitance has been charged, said detecting means including a charge storage capacitor coupled to said thin film transistor and adapted to be charged by the channel current thereof; an output amplifier for taking out an output signal of said photosensor; and detecting switching element adapted to be turned on and off by an externally applied control signal to couple said charge storage capacitor to said output amplifier.

2. The photosensor according to claim 1, wherein said photodiode includes a cathode electrode; an anode electrode formed of transparent electrical conductive film; and hydrogenated amorphous silicon film sandwiched between said cathode and anode electrodes, said cathode and anode electrodes being electrically connected to said drain and gate electrodes of said thin film transistor, respectively.

3. The photosensor according to claim 1, wherein said photodiode includes a cathode electrode; an anode electrode formed of transparent electrical conductive film; and hydrogenated amorphous silicon film sandwiched between said cathode and anode electrodes, said cathode and anode electrodes being electrically connected to said gate and source electrodes of said thin film transistor, respectively.

4. The photosensor according to claim 1, wherein said charging means comprises a DC power supply; and a charging switching element for coupling said DC power supply to said photodiode for charging said inter-electrode capacitance thereof, said charging switching element formed of a thin film transistor formed on said circuit substrate adjacent to said first-mentioned thin film transistor and photodiode, and adapted to be turned on and off by an externally supplied control signal.

5. The photosensor according to claim 1, wherein said detecting switch element is formed of a thin film transistor, and said charge storage capacitor and said detecting switching element are formed on said circuit substrate.

6. An image sensor comprising:
a circuit substrate; and
a plurality of photosensors formed in line on said circuit substrate;
each of said photosensors comprising:
a thin film transistor formed on said circuit substrate and having a gate electrode and drain and source electrodes forming a channel therebetween in response to a control voltage applied to said gate electrode, a channel current controlled by said control voltage flowing through said channel;
an amorphous silicon photodiode formed on said substrate integral with said thin film transistor between one of said drain and source electrodes and said gate electrode of said thin film transistor, said amorphous silicon photodiode having an inter-electrode capacitance;
charging means coupled to said photodiode for charging said inter-electrode capacitance of said photodiode; and
detecting means coupled to said thin film transistor for detecting the channel current flowing through said thin film transistor controlled by a voltage across said inter-electrode capacitance of said photodiode, the voltage varying in response to incident light after said inter-electrode capacitance has been charged; said detecting means including a charge storage capacitor coupled to said thin film transistor and adapted to be charged by the channel current thereof; an output amplifier for taking out an output signal of said photosensor; and a detecting switching element adapted to be turned on and off by an externally applied control signal to couple said charge storage capacitor to said output amplifier.

7. A photosensor comprising:
a circuit substrate;
a thin film transistor formed on said circuit substrate and having a gate electrode and drain and source electrodes forming a channel therebetween in response to a control voltage applied to said gate electrode, a channel current controlled by said control voltage flowing through said channel;
an amorphous silicon photodiode formed on said substrate integral with said thin film transistor between one of said drain and source electrodes and said gate electrode of said thin film transistor, said amorphous silicon photodiode having an inter-electrode capacitance;
charging means coupled to said photodiode for charging said inter-electrode capacitance of said photodiode; and
detecting means coupled to said thin film transistor for detecting the channel current of said thin film transistor which is controlled by a voltage across said inter-electrode capacitance of said photodiode, the voltage varying in response to incident light after said inter-electrode capacitance has been charged; said detecting means including a charge storage capacitor coupled to said thin film transistor and adapted to be charged by the channel current thereof; an output amplifier for taking out an output signal of said photosensor; and a detecting switching element adapted to be turned on and off by an externally applied control signal to couple said charge storage capacitor to said output amplifier.

8. A photosensor according to claim 7, wherein said charge storage capacitor is formed integrally with said thin film transistor between the other of said drain and source electrodes of said thin film transistor.

* * * * *